(12) United States Patent
Fujimoto et al.

(10) Patent No.: US 9,807,889 B2
(45) Date of Patent: Oct. 31, 2017

(54) METHOD OF MOUNTING ELECTRONIC COMPONENT TO CIRCUIT BOARD

(71) Applicants: OSAKA UNIVERSITY, Osaka (JP); SENJU METAL INDUSTRY CO., LTD., Tokyo (JP)

(72) Inventors: Kozo Fujimoto, Osaka (JP); Shinji Fukumoto, Osaka (JP); Michiya Matsushima, Osaka (JP); Satoshi Watanabe, Saitama-ken (JP); Takeshi Kan, Saitama-ken (JP); Minoru Ueshima, Tokyo (JP); Takeshi Sakamoto, Tokyo (JP); Shu Inoue, Nara-ken (JP)

(73) Assignees: OSAKA UNIVERSITY, Osaka (JP); SENJU METAL INDUSTRY CO., LTD., Tokyo (JP)

( * ) Notice: Subject to any disclaimer, the term of this patent is extended or adjusted under 35 U.S.C. 154(b) by 440 days.

(21) Appl. No.: 13/953,682

(22) Filed: Jul. 29, 2013

(65) Prior Publication Data
US 2014/0029224 A1    Jan. 30, 2014

(30) Foreign Application Priority Data

Jul. 30, 2012 (JP) .................................. 2012-168914

(51) Int. Cl.
H05K 3/30 (2006.01)
H05K 3/34 (2006.01)
H05K 1/18 (2006.01)

(52) U.S. Cl.
CPC ............. *H05K 3/341* (2013.01); *H05K 1/181* (2013.01); *H05K 3/3478* (2013.01);
(Continued)

(58) Field of Classification Search
CPC ...... H05K 3/341; H05K 3/3478; H05K 1/181; H05K 2203/0405; B32B 27/38;
(Continued)

(56) References Cited

U.S. PATENT DOCUMENTS

| | | | |
|---|---|---|---|
| 6,878,435 B2* | 4/2005 | Paik ..................... | B32B 27/38 428/323 |
| 7,759,162 B2* | 7/2010 | Karashima ............ | H01L 21/563 257/777 |
| 2009/0203169 A1 | 8/2009 | Tomita et al. | |

FOREIGN PATENT DOCUMENTS

JP 2001-230529 A 8/2001
JP 2001-239395 9/2001
(Continued)

OTHER PUBLICATIONS

Japanese Industrial Standard, JIS Z 3282:2006 Soft solders—Chemical compositions and forms, Feb. 2007, 1-16, Japanese Standards Association, Tokyo, Japan.
(Continued)

*Primary Examiner* — Donghai D Nguyen
(74) *Attorney, Agent, or Firm* — Nixon Peabody LLP; Jeffrey L. Costellia

(57) ABSTRACT

An method of mounting electronic component includes: providing a connecting layer between a wiring and an electronic component, the connecting layer including a conductive layer formed of a solder powder-containing resin composition containing thermosetting resin, solder powder, and a reducing agent and one or two layers of a thermoplastic resin layer formed of thermoplastic resin; and electrically connecting the electronic component to the wiring through the connecting layer.

2 Claims, 4 Drawing Sheets

(52) U.S. Cl.
CPC .... *H05K 2203/0405* (2013.01); *Y02P 70/613* (2015.11); *Y10T 29/49144* (2015.01)

(58) Field of Classification Search
CPC ............. H01L 21/563; Y10T 29/49144; Y10T 29/4913; Y10T 29/49146; Y02P 70/613
USPC .................. 29/831, 832, 840, 841; 174/260; 257/777, 778; 428/323, 343, 355 EF; 438/108
See application file for complete search history.

(56) References Cited

FOREIGN PATENT DOCUMENTS

| | | |
|---|---|---|
| JP | 2004-260131 A | 9/2004 |
| JP | WO2006/082909 A1 | 8/2006 |
| JP | 2007-81198 A | 3/2007 |
| JP | 2010-103382 A | 5/2010 |
| JP | 2011-111474 A | 6/2011 |
| JP | 2011-171258 A | 9/2011 |

OTHER PUBLICATIONS

Notice of Reasons for Rejection in Japanese Application No. 2012-168914, dated Nov. 17, 2015.
Notice of Reasons for Rejection in Japanese Application No. 2012-168914, dated Jul. 5, 2016.

\* cited by examiner

METHOD OF MOUNTING ELECTRONIC COMPONENT TO CIRCUIT BOARD

BACKGROUND OF THE INVENTION

Field of the Invention

The present invention relates to a method of mounting electronic component, a circuit board, a solder joint portion, a printed wiring board with a connecting layer, and a sheet-like joint member.

Priority is claimed on Japanese Patent Application No. 2012-168914, filed Jul. 30, 2012, the content of which is incorporated herein by reference.

Description of Related Art

In recent years, the density of electronic components, such as transistors, on the printed wiring board, has increased with an increase in the number of functions or reductions in size and weight of information apparatuses, such as mobile phones or personal computers.

For this reason, since a pitch between terminals of electronic components has narrowed, improvements in high-density mounting technology used to bond electronic components and wirings to each other have been required.

As a method of mounting electronic components, soldering mounting using solder paste has been widely performed.

As the soldering mounting, for example, a method is generally used in which solder paste is applied onto the printed wiring board by screen printing or the like and electronic components are disposed on the solder paste (for example, refer to Japanese Unexamined Patent Application, First Publication No. 2001-239395).

In addition, a mounting manufacturer usually performs both a step of applying the solder paste onto the printed wiring board manufactured by the board manufacturer and a step of disposing the electronic components on the solder paste.

SUMMARY OF THE INVENTION

However, the number of steps that the mounting manufacturer has to perform has increased with an increase in the number of functions of information apparatuses.

In addition, since unique equipment is required for each step, the cost is also increased from the economical point of view.

The invention has been made in view of the above-described situation, and it is an object of the invention to provide a method of mounting electronic component capable of reducing the number of steps.

According to a first aspect of the invention, there is provided a method of mounting electronic component including: providing a connecting layer between a wiring and an electronic component, the connecting layer including a conductive layer formed of a solder powder-containing resin composition containing thermosetting resin, solder powder, and a reducing agent and one or two layers of a thermoplastic resin layer formed of thermoplastic resin; and electrically connecting the electronic component to the wiring through the connecting layer.

The thermoplastic resin layer may be provided between the conductive layer and the electronic component, and the step of electrically connecting the electronic component to the wiring may include heating the connecting layer to the melting point temperature or higher of the solder powder.

A thermosetting resin having a viscosity, at which the solder powder flows within the conductive layer at a temperature at which the solder powder melts, may be used as the thermosetting resin.

According to a second aspect of the invention, there is provided a circuit substrate manufactured by the method of mounting electronic component according to the first aspect of the invention.

According to a third aspect of the invention, there is provided a solder joint portion of an electronic component formed by the method of mounting electronic component according the first aspect of the invention.

According to a fourth aspect of the invention, there is provided a printed wiring board with a connecting layer including: a printed wiring board; a conductive layer formed of a solder powder-containing resin composition containing thermosetting resin, solder powder, and a reducing agent; and a thermoplastic resin layer formed of thermoplastic resin. The conductive layer is provided on a wiring of the printed wiring board, and the thermoplastic resin layer covers at least the conductive layer.

According to a fifth aspect of the invention, there is provided a sheet-like joint member including: a thermoplastic resin layer of two layers formed of thermoplastic resin; and a conductive layer that is formed of a solder powder-containing resin composition containing thermosetting resin, solder powder, and a reducing agent and that is provided between the two layers of the thermoplastic resin layer.

DETAILED DESCRIPTION OF THE INVENTION

Figure 1A:
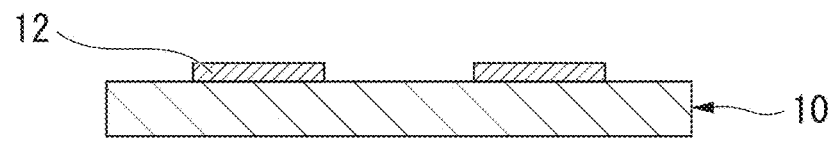
FIG. 1A is a schematic cross-sectional view showing a method of mounting electronic component according to an embodiment of the invention.

A method of mounting electronic component of the invention is a method of providing a connecting layer, which includes a conductive layer (α) and a thermoplastic resin layer (β), between a wiring and an electronic component and connecting the electronic component to the wiring through the connecting layer.

(Conductive Layer (α))

The conductive layer (α) is a layer formed of a solder powder-containing resin composition that contains thermosetting resin (a1), solder powder (a2), and a reducing agent (a3).

Hereinafter, the thermosetting resin (a1), the solder powder (a2), and the reducing agent (a3) are also referred to as an (a1) component, an (a2) component, and an (a3) component, respectively.

The solder powder-containing resin composition can be prepared by mixing the (a1) component, the (a2) component, and the (a3) component.

As the thickness of the conductive layer (α), 10 μm to 1000 μm is preferable, and 20 μm to 350 μm is more preferable.

If the thickness of the conductive layer (α) is less than the preferable lower limit, the solder amount is reduced. As a result, problems, such as a difficulty of performing sufficient soldering or a reduction in mechanical strength after soldering, easily occurs.

On the other hand, if the thickness of the conductive layer (α) exceeds the preferable upper limit, the solder amount is increased. As a result, a problem, such as a bridge, easily occurs.

(a1) Component: Thermosetting Resin

Examples of the (a1) component include epoxy resins such as a bisphenol A type epoxy resin, a bisphenol F type epoxy resin, a novolac type epoxy resin, and a liquid epoxy compound having one or more glycidyl groups in one molecule; polyester resins such as an unsaturated polyester resin; urethane resins; phenol resins such as a resole type phenol resin and a novolac type phenol resin; and imide resins.

Among them, it is preferable that the (a1) component have a viscosity at which the (a2) component to be described later can flow within the conductive layer (α) at a temperature at which the (a2) component melts. For example, the (a1) component is preferably a thermosetting resin having the above-described viscosity.

"(a2) component can flow within the conductive layer (α)" means that the (a2) component can move within the solder powder-containing resin composition, which forms the conductive layer (α), by heating the (a2) component to the temperature at which the (a2) component melts.

"Viscosity at which the (a2) component can flow within the conductive layer (α)" means a viscosity of the mixture of the (a1) component, the (a3) component, and other components mixed when necessary at a temperature at which the (a2) component melts.

This viscosity can be measured using VISCOANALYSER VAR100 made by REOLOGICA INSTRUMENTS AB.

The temperature at which the (a2) component melts is usually 100° C. to 380° C.

At the temperature at which the (a2) component melts, the viscosity at which the (a2) component can flow within the conductive layer (α) is 0.1 dPa·s to 100 dPa·s, and is 0.1 dPa·s to 10 dPa·s in particular.

Within this viscosity range, electronic components and wirings are easily connected to each other in a better bonding state.

In addition, since the (a2) component can easily move within the conductive layer (α), the (a2) components are easily fused.

In addition, since a metal connection portion and a resin layer adjacent to the metal connection portion and containing the (a1) component are easily formed, adhesion between the electronic component and the wiring and the environmental resistance of the metal connection portion are increased.

As the (a1) component, one kind of component may be used, or two or more kinds of components may be used together.

The content of the (a1) component in the solder powder-containing resin composition is preferably 40 vol % to 83 vol %.

If the amount of the (a1) component is less than the preferable lower limit, it is difficult to obtain the protective effect of the metal connection portion surface.

On the other hand, if the amount of the (a1) component exceeds the preferable upper limit, the content of the (a2) component becomes relatively small. As a result, the adhesion strength between the wiring and the electronic component tends to be reduced.

(a2) Component: Solder Powder

Examples of the material forming the (a2) component metals include such as Sn, Pb, Cu, Zn, Ag, Sb, In, Bi, and Ge, or alloys of these metals.

The alloy composition or the type of metal of the (a2) component may be appropriately selected in consideration of the specifications required for component mounting, the use environment of the component-mounted circuit board, and the like.

Examples of the Alloy include solder alloys described in JIS Z 3282: 2006, specifically, Sn-5Pb, Sn-37Pb, Pb-5Sn, Pb-10Sn, Pb-40Sn, Sn-40Pb-3Bi, Sn-36Pb-2Ag, Sn-5Sb, Sn-0.7Cu, Sn-6Cu-2Ag, Sn-5Ag, Sn-3.5Ag, Sn-3Ag-0.5Cu, Sn-2.5Ag-1Bi-0.5Cu, Sn-4In-3.5Ag-0.5Bi, Sn-9Zn, Sn-8Zn-3Bi, Sn-58Bi, Sn-52In (all are mass ratios), and the like.

Undoubtedly, additive elements may be added to these alloy compositions when necessary.

As the additive element, for example, P, Ge, Ga, Fe, Ni, Co, Mn, Cr, Mo, Pd, Al, Ti, Au, Pt, and the like may be added in order to improve the wettability of the alloy with respect to the wiring or improve the mechanical strength of the metal connection portion formed by the alloy.

As the (a2) component, one kind of component may be used, or two or more kinds of components may be used together.

The content of the (a2) component in the solder powder-containing resin composition is appropriately determined by the electrode size, the electrode pitch, and the like in an electronic component to be mounted, and is preferably 15 vol % or more and more preferably 15 vol % to 50 vol %.

If the content of the (a2) component is equal to or greater than the preferable lower limit, electronic components and wirings are connected to each other with sufficient strength.

On the other hand, the upper limit of the content of the (a2) component is usually determined by the maximum filling amount of spherical solder powder.

(a3) Component: Reducing Agent

Examples of the (a3) component include carboxylic acid, nitrogen compounds, and compounds with a phenol-based hydroxyl group. Among them, carboxylic acid is preferable.

Examples of the carboxylic acid include saturated fatty acids such as formic acid, acetic acid, propionic acid, butyric acid, lauric acid, and stearic acid; unsaturated fatty acids such as oleic acid; and dicarboxylic acids such as glutaric acid and adipic acid. Also, dicarboxylic acids and saturated fatty acids are preferable. From the point of view of the oxide layer removal force, glutaric acid and acetic acid are more preferable.

Examples of the nitrogen compounds include monoethanolamine, diethanolamine, and triethanolamine.

Examples of the compounds with a phenol-based hydroxyl group include phenol, a methylene bisphenol compound, and an alkylidene bisphenols compound.

As the (a3) component, one kind of component may be used, or two or more kinds of components may be used together.

The content of the (a3) component in the solder powder-containing resin composition is preferably 0.5 parts by mass to 5 parts by mass and more preferably 1 parts by mass to 2.5 parts by mass relative to 100 parts by mass of the (a2) component.

If the content of the (a3) component is less than the preferable lower limit, the removal of the oxide layer of the solder powder surface is not sufficient. Therefore, it is difficult to form a suitable fusion state.

On the other hand, if the content of the (a3) component exceeds the preferable upper limit, the (a3) component is easy to remain as voids in a cured product due to thermal decomposition during reflow.

The solder powder-containing resin composition may contain components other than the (a1) component, the (a2) component, and the (a3) component.

Other components include curing agents for curing the (a1) component.

Examples of the curing agents include amine curing agents, acid anhydride curing agents, cationic curing agents, isocyanate curing agents, and imidazole curing agents can be mentioned.

Among them, curing agents that can cure the (a1) component so that the (a1) component has a viscosity at which the (a2) component can flow within the conductive layer (α) at a temperature at which the (a2) component melts, in particular, cationic curing agents are preferable.

In addition, other components include known components, for example, additives for viscosity adjustment (thixotropic imparting agents and the like), chelating agents, rust inhibitors, dispersants, antifoaming agents, and organic solvents, such as ethylene glycol, propylene glycol, and terpineol.

(Thermoplastic Resin Layer (β))

The thermoplastic resin layer (β) is a layer formed of thermoplastic resin.

As the thickness of the thermoplastic resin layer (β), 1 μm to 100 μm is preferable.

If the thickness of the thermoplastic resin layer (β) is less than the preferable lower limit, a resin layer formed at the time of mounting becomes thin. Accordingly, it is difficult to obtain the protective effect of the metal connection portion surface.

On the other hand, if the thickness of the thermoplastic resin layer (β) exceeds the preferable upper limit, solder powder is less likely to be wet in wirings or electronic components during mounting.

Any thermoplastic resin that melts at mounting temperature can be used. For example, thermoplastic resin includes acrylic resin, polyethylene, polypropylene, polyamide, polyacetal, polycarbonate, phenoxy resin, phenol resin, polyester resin, polyphenylene sulfide, and thermoplastic polyimide.

Among them, phenoxy resin and polyester resin are preferable from the point of view in which the fusion of the (a2) component is not inhibited during mounting.

As the thermoplastic resin, one kind of component may be used, or two or more kinds of components may be used together.

In addition to the thermoplastic resin, the thermoplastic resin layer (β) may contain, for example, a thermosetting resin in a range not inhibiting the fusion of the (a2) component by melting at mounting temperature.

(Wirings of the Printed Wiring Board and Terminal Portions of Electronic Components)

Although materials that form wirings of the printed wiring board and terminal portions of electronic components are not particularly limited, it is preferable to form the wirings of the printed wiring board and the terminal portions of electronic components using Cu, Au, Ag, Sn, Bi, Ni, Pd, Pb, and the like.

(Method of Connecting Electronic Components to Wirings Used for Mounting)

As a method of providing a connecting layer, which is configured to include the conductive layer (α) and the thermoplastic resin layer (β), between wirings and electronic components and electrically connecting the electronic components to the wirings through the connecting layer, the following two methods can be specifically mentioned.

(I) Method including a step of providing a connecting layer including the conductive layer (α) and the thermoplastic resin layer (β) of one layer by forming the conductive layer (α) by applying a solder powder-containing resin composition onto wirings of a printed wiring board and then forming the thermoplastic resin layer (β) on the surface of the printed wiring board on which the conductive layer (α) is formed; and a step of connecting electronic components to the connecting layer.

(II) Method including a step of forming a sheet-like joint member (three-layer structure) having the conductive layer (α) between two layers of the thermoplastic resin layer (β); and a step of disposing the sheet-like joint member on at least wirings of a printed wiring board and connecting electronic components to the sheet-like joint member.

[Mounting Method of (I)]

A specific mounting method of the above-described (I) includes, for example, a method including (I-1) to (I-3) steps.

Explanation will be given with reference to FIGS. 1A to 1D.

(I-1): Step of forming the conductive layer (α) on wirings of a printed wiring board.

(I-2): Step of forming the thermoplastic resin layer (β) on the surface of the printed wiring board, on which the conductive layer (α) is formed, in order to obtain a printed wiring board including a connecting layer configured to include the conductive layer (α) and the thermoplastic resin layer (β) (printed wiring board with a connecting layer).

(I-3): Step of disposing electronic components on the connecting layer, which is provided on the wirings of the printed wiring board and electrically connecting the electronic components and the wirings to each other to obtain a circuit board.

Hereinafter, the (I-1) to (I-3) steps will be described in more detail.

(I-1) Step:

A printed wiring board 10 having a surface on which a wiring 12 is formed is prepared (FIG. 1A).

The conductive layer (α) can be formed as follows.

Figure 1B:
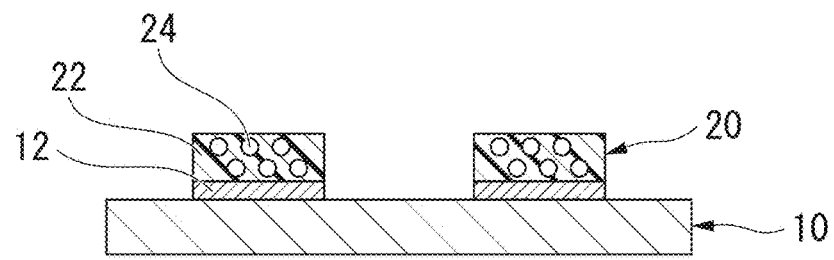
FIG. 1B is a schematic cross-sectional view showing the method of mounting electronic component according to the embodiment of the invention.

A conductive layer (α) 20 containing thermosetting resin 22, solder powder 24, and a reducing agent (not shown) is formed by applying a solder powder-containing resin composition onto at least a part of the wiring 12 formed on the printed wiring board 10 (FIG. 1B).

In this case, it is preferable to form the conductive layer (α) 20 in a liquid state or a semi-solid state without curing the conductive layer (α) 20.

As a method of applying a solder powder-containing resin composition, any method capable of forming the conductive layer (α) 20 on the wiring 12 can be used, and example of a method of applying a solder powder-containing resin composition includes a method capable of forming a pattern, such as screen printing.

Figure 1C:
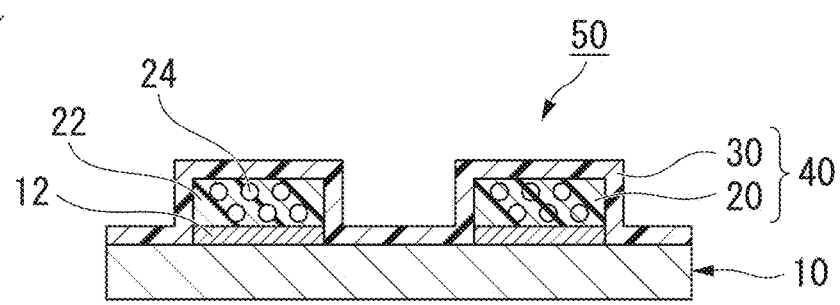
FIG. 1C is a schematic cross-sectional view showing the method of mounting electronic component according to the embodiment of the invention.

(I-2) Step:

Then, a thermoplastic resin layer (β) 30 is formed by applying, for example, a resin solution, in which a thermoplastic resin is dissolved in an organic solvent, onto the surface of the printed wiring board 10, on which the conductive layer (α) 20 is formed, and drying the resin solution (FIG. 1C).

In the mounting method of (I), it is preferable that the thickness of the thermoplastic resin layer (β) 30 be 1 μm to 100 μm.

If the thickness of the thermoplastic resin layer (β) 30 is less than the preferable lower limit, a resin layer formed at the time of mounting becomes thin. Accordingly, it is difficult to obtain the protective effect of the metal connection portion surface.

On the other hand, if the thickness of the thermoplastic resin layer (β) 30 exceeds the preferable upper limit, solder powder is less likely to be wet in wirings or electronic components during mounting.

Any organic solvent can be used without particular limitation as long as it can dissolve the selected thermoplastic resin.

Drying after applying the resin solution is preferably performed to the extent that tack is not left.

As a temperature when drying the resin solution, 60° C. to 160° C. is preferable, and 80° C. to 150° C. is more preferable.

As a time for which the drying process is performed, 5 to 60 minutes is preferable, and 10 to 30 minutes is more preferable.

As a method of forming the thermoplastic resin layer (β) 30, methods other than the method of applying the resin solution can also be used. For example, it is possible to use a method of bonding a film-like thermoplastic resin prepared in advance to the surface of the printed wiring board 10 on which the conductive layer (α) 20 is formed.

Through the above-described steps, a printed wiring board with a connecting layer 50 is manufactured which includes the printed wiring board 10 and a connecting layer 40 and in which the connecting layer 40 includes the conductive layer (α) 20 provided on the wiring 12 and the thermoplastic resin layer (β) 30 that covers at least the conductive layer (α) 20.

Figure 1D:
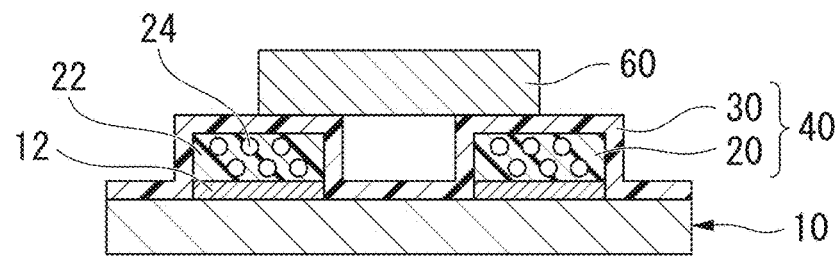
FIG. 1D is a schematic cross-sectional view showing the method of mounting electronic component according to the embodiment of the invention.

(I-3) Step:

Then, an electronic component 60 is disposed on the connecting layer 40 so that the target circuit is formed (FIG. 1D).

Then, the thermosetting resin 22 is cured and a conductive path is formed between the wiring 12 and the electronic component 60 by heating at least the connecting layer 40 to the melting point or higher of the solder powder 24.

As a result, a circuit substrate in which the electronic component 60 is electrically connected to the wiring 12 is obtained.

Thus, in the method of (I), the electronic component 60 is mounted on the printed wiring board with a connecting layer 50.

By applying such a method of (I), the mounting manufacturer has only to dispose the electronic component 60 on the printed wiring board with a connecting layer 50, and does not need to perform a step of applying the solder paste onto the printed wiring board 10 in the related art.

[Mounting Method of (II)]

A specific mounting method of the above-described (II) includes, for example, a method including (II-1) and (II-2) steps.

Explanation will be given with reference to FIGS. 2A and 2B.

(II-1): Step of manufacturing a sheet-like joint member (three-layer structure)

(II-2): Step of disposing the sheet-like joint member on at least a wiring of a printed wiring board and bonding the sheet-like joint member and the wiring to each other to obtain a circuit board.

Hereinafter, the (II-1) and (II-2) steps will be described in more detail.

(II-1) Step:

The sheet-like joint member 70 (three-layer structure) can be manufactured as follows.

A thermoplastic resin layer (β) 30a is formed by applying, for example, a resin solution, in which a thermoplastic resin is dissolved in an organic solvent, onto a support subjected to release treatment and drying the resin solution.

In this case, it is preferable to form the thermoplastic resin layer (β) 30a in a liquid state or a semi-solid state.

Drying after applying the resin solution is the same as the drying method in the (I-2) step.

Any organic solvent can be used without particular limitation as long as it can dissolve the selected thermoplastic resin.

Then, a conductive layer (α) 20 containing thermosetting resin 22, solder powder 24, and a reducing agent (not shown) is formed by applying a solder powder-containing resin composition onto the thermoplastic resin layer (β) 30a.

In this case, it is preferable to form the conductive layer (α) 20 in a liquid state or a semi-solid state without curing the conductive layer (α) 20.

Then, a thermoplastic resin layer (β) 30b is formed by applying a resin solution, in which a thermoplastic resin is dissolved in an organic solvent, onto the conductive layer (α) 20 and drying the resin solution.

In this case, it is preferable to form the thermoplastic resin layer (β) 30b in a liquid state or a semi-solid state.

The type of the thermoplastic resin that forms the thermoplastic resin layer (β) 30b may be the same as or different from the thermoplastic resin that forms the thermoplastic resin layer (β) 30a.

Drying after applying the resin solution is the same as the drying method in the (I-2) step.

Any organic solvent can be used without particular limitation as long as it can dissolve the selected thermoplastic resin.

As a method of forming the thermoplastic resin layer (β) 30a and the thermoplastic resin layer (β) 30b, methods other than the method of applying the resin solution can also be used. For example, it is possible to use a method of using a film-like thermoplastic resin prepared in advance.

In the mounting method of (II), it is preferable that the thickness of each of the thermoplastic resin layers (β) 30a and 30b be 1 μm to 100 μm.

If the thickness of each of the thermoplastic resin layers (β) 30a and 30b is less than the preferable lower limit, a resin layer formed at the time of mounting becomes thin. Accordingly, it is difficult to obtain the protective effect of the metal connection portion surface.

On the other hand, if the thickness of each of the thermoplastic resin layers (β) 30a and 30b exceeds the preferable upper limit, solder powder is less likely to be wet in wirings or electronic components during mounting.

Figure 2A:
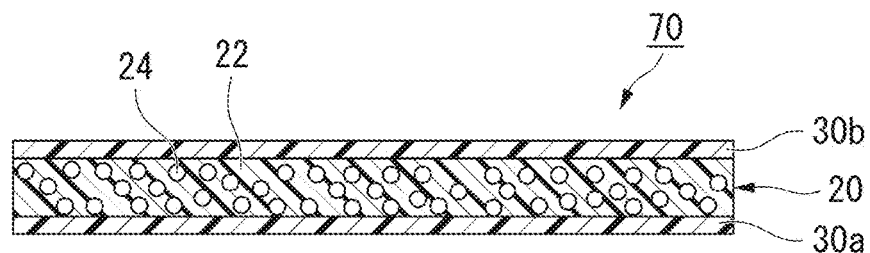
FIG. 2A is a schematic cross-sectional view showing a method of mounting electronic component according to another embodiment of the invention.

Finally, the sheet-like joint member 70 (three-layer structure) having the conductive layer (α) 20 between the thermoplastic resin layers (β) 30a and 30b of two layers is manufactured by peeling off the support (FIG. 2A).

As the sheet-like joint member 70, a sheet manufactured in a predetermined size can be used as it is, or a sheet cut appropriately in a required size can be used.

Figure 2B:
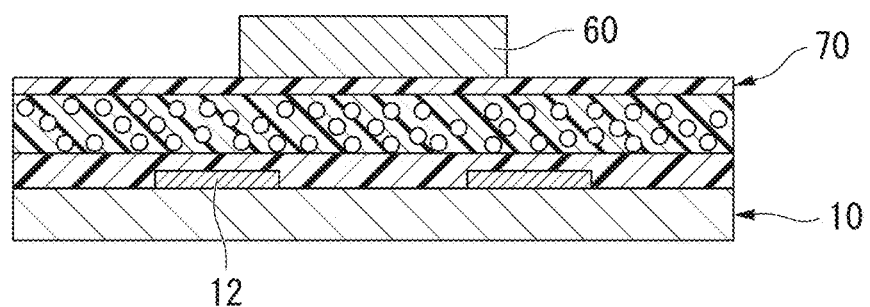
FIG. 2B is a schematic cross-sectional view showing the method of mounting electronic component according to another embodiment of the invention.

(II-2) Step:

Then, the sheet-like joint member 70 is disposed on at least the wiring of the printed wiring board 10, and then the electronic component 60 is disposed on the sheet-like joint member 70 to form a target circuit (FIG. 2B).

Then, the thermosetting resin 22 is cured and a conductive path is formed between the wiring 12 and the electronic component 60 by heating at least the sheet-like joint member 70 to the melting point or higher of the solder powder 24.

As a result, a circuit substrate in which the electronic component 60 is electrically connected to the wiring 12 is obtained.

Thus, in the method of (II), the sheet-like joint member 70 is disposed as a connecting layer on the printed wiring board 10 and the electronic component 60 is mounted.

By applying such a method of (II), the mounting manufacturer has only to dispose the electronic component 60 and the sheet-like joint member 70 together on the printed wiring board 10, and does not need to perform a step of applying the solder paste onto the printed wiring board 10 in the conventional art.

According to the method of mounting electronic component described above, it is possible to omit the step of applying the solder paste onto the printed wiring board in a mounting manufacturer. Therefore, it is possible to reduce the number of steps in mounting.

When applying the solder paste, for example, by screen printing, the cost is increased due to the selection of a mask, setting of printing process conditions, and the like.

By applying the mounting method according to the invention, the cost is reduced since the step of applying the solder paste onto the printed wiring board can be omitted.

In addition, a mounting manufacturer does not need to manage the printing process conditions and the like.

In the connecting layer 40 in the mounting method of (I) and the connecting layer (sheet-like joint member 70) in the mounting method of (II), the solder powder 24 is dispersed in the conductive layer (α) 20 before heating.

When the connecting layer 40 in the mounting method of (I) and the connecting layer (sheet-like joint member 70) in the mounting method of (II) are heated to the melting point or higher of the solder powder 24 during mounting, the inside of the conductive layer (α) 20 is changed to a state of viscosity at which the solder powder 24 can move within the conductive layer (α) 20. As a result, components of the solder powder 24 are fused with each other.

While the fusion between the components of the solder powder 24 proceeds, the solder powder 24 gathers in the wiring 12 and the electronic component 60 that are easy to be wet. Eventually, a conductive path connecting the wiring 12 and the electronic component 60 to each other is formed.

In this case, the thermosetting resin 22 and the thermoplastic resin, which forms the thermoplastic resin layers (β) 30, 30a, and 30b, flow into the periphery of the conductive path to form a resin layer.

Figure 3:
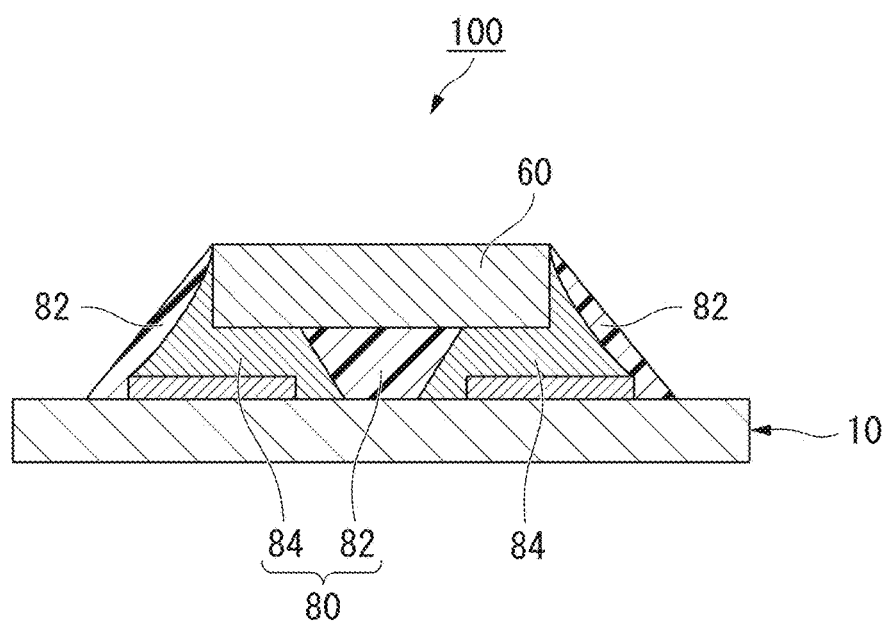
FIG. 3 is a schematic cross-sectional view showing an embodiment of a circuit board manufactured by the method of mounting electronic component of the invention.

FIG. 3 shows an embodiment of the circuit board manufactured by applying the method of mounting electronic component of the invention.

A circuit board 100 includes the printed wiring board 10, the electronic component 60, and a solder joint portion 80 to connect the printed wiring board 10 and the electronic component 60 to each other.

The solder joint portion 80 includes a resin layer 82 and a metal connection portion 84, and is formed by heating the connecting layer.

The resin layer 82 is a layer having the thermosetting resin 22 and a thermoplastic resin, which forms the thermoplastic resin layer (β), as main components, and the metal connection portion 84 is formed by the fusion between components of the solder powder 24.

In the circuit board 100, the printed wiring board 10 and the electronic component 60 are bonded to each other not only by the metal connection portion 84 but also by the resin layer 82. Accordingly, adhesion between the printed wiring board 10 and the electronic component 60 is high.

In addition, since the metal connection portion 84 is protected by the resin layer 82, the environmental resistance of the metal connection portion 84 is also high.

In recent years, the density of electronic components, such as transistors, on the printed wiring board, has increased with an increase in the number of functions or reductions in the size and weight of information apparatuses. As a result, demands for high quality and high reliability of the circuit board have been growing.

In response to such demands, by applying the printed wiring board with a connecting layer or the sheet-like joint member of the invention, it is possible to achieve the high quality and the high reliability of the circuit board.

In addition, according to the method of mounting electronic component of the invention, it is possible to reduce the mounting cost.

The method of mounting electronic component of the invention can be appropriately applied to mounting onto a printed wiring board, a ball grid array (BGA), a land grid array (LGA), a quad flat package (QFP), a chip scale package (CSP) array, chip mounting, and the like.

Specific examples of the electronic component include a chip resistor, a transistor, a chip capacitor, a chip inductor, and the like.

EXAMPLES

Hereinafter, the invention will be described more specifically by way of examples. However, the invention is not limited to these examples.

[Example of Preparing a Solder Powder-Containing Resin Composition]

A solder powder-containing resin composition was prepared by mixing 30 parts by mass (13.3 vol %) of epoxy resin (made by Mitsubishi Chemical Corporation, product name: EP 834) and 70 parts by mass (31.1 vol %) of epoxy resin (made by Ube Industries Ltd., product name: OXBP) as the (a1) component, 614 parts by mass (50 vol %) of ternary solder powder of Sn96.5%-Ag3%-Cu0.5% (mass ratio) as the (a2) component, 10.5 parts by mass of 2,4-diethyl glutaric acid as the (a3) component, and 7.0 parts by mass of additive for viscosity adjustment (made by Kusumoto Kasei Co., Ltd., product name: Disparlon 6700).

In addition, at a temperature (150° C.) at which the (a2) component melted, the viscosity of the epoxy resin mixture as the (a1) component, which was measured by the VISCOANALYSER VAR100 made by REOLOGICA INSTRUMENTS AB, was 1.0 dPa·s.

[Example of Mounting onto a Chip]

Example 1

Using the mounting method of (I) described above, a circuit substrate was obtained by connecting a chip resistor to a wiring of a printed wiring board.

(I-1) Step:

A liquid conductive layer (α) was formed by applying the solder powder-containing resin composition, which was obtained in the above-described preparation example, onto the wiring of the printed wiring board by screen printing.

The thickness of the conductive layer (α) was 55 μm.

(I-2) Step:

Then, a coating film (thermoplastic resin layer (β)) was formed by applying a resin solution (made by Unitika Ltd., product name: Elitel UE-9800, 36 percent by mass of ethyldiglycol acetate solution), in which polyester resin was dissolved as a thermoplastic resin, onto the surface of the printed wiring board facing the conductive layer (α).

The thickness of the thermoplastic resin layer (β) was 55 μm.

Then, the printed wiring board including a connecting layer, which was configured to include the conductive layer (α) and the thermoplastic resin layer (β) of one layer, was manufactured by drying the resin solution in a hot air circulation drying furnace of 85° C. for 10 minutes.

(I-3) Step:

Then, a chip resistor was mounted on the connecting layer by heating the chip resistor at 120° C. for 80 seconds using a chip mounter and then heating the chip resistor at 230° C. for 60 seconds, thereby obtaining a circuit substrate.

The circuit substrate obtained in Example 1 was cut in a direction perpendicular to the surface of the printed wiring board, and the cross-section of a connection portion between the electronic component (chip resistor) and the printed wiring board was observed.

Figure 4:
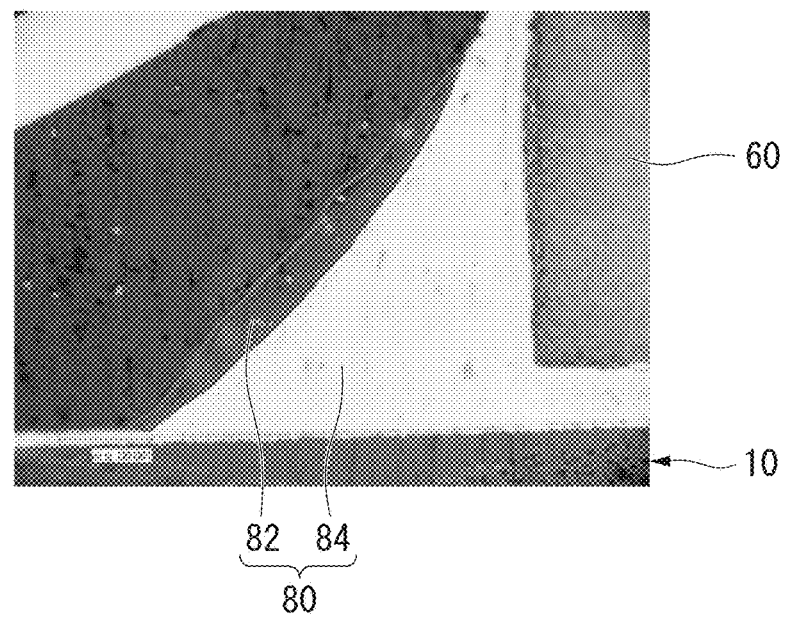
FIG. 4 is a cross-sectional photograph showing a connection portion between an electronic component and a printed wiring board in a circuit board obtained in Example 1.

FIG. 4 is a cross-sectional photograph obtained by photographing the cross-section using a scanning electron microscope (SEM: "JSM-6360LV" made by JEOL Co., Ltd., observed at an acceleration voltage of 15 kV).

From FIG. 4, it can be seen that the electronic component 60 (chip resistor) and the printed wiring board 10 are satisfactorily connected to each other through the solder Joint portion 80 and the metal connection portion 84 is protected by the resin layer 82 in the solder Joint portion 80.

Example 2

Using the mounting method of (II) described above, a circuit board was obtained by connecting a chip resistor to an electrode of a printed wiring board.

(II-1) Step:

Then, a thermoplastic resin layer (β1) was formed by applying a resin solution (made by Unitika Ltd., product name: Elitel UE-9800, 36 percent by mass of ethyldiglycol acetate solution), in which polyester resin was dissolved as a thermoplastic resin, onto a PET film after release treatment and drying it in a hot air circulation drying furnace of 85° C. for 10 minutes.

The thickness of the thermoplastic resin layer (β1) was 13 μm.

Then, a liquid conductive layer (α) was formed by applying the solder powder-containing resin composition, which was obtained in the above-described preparation example, onto the thermoplastic resin layer (β1) using an applicator.

The thickness of the conductive layer (α) was 55 μm.

Then, a thermoplastic resin layer (β2) was formed by applying a resin solution, in which the above-described polyester resin was dissolved, onto the conductive layer (α) and drying it in the hot air circulation drying furnace of 85° C. for 10 minutes.

The thickness of the thermoplastic resin layer (β2) was 13 μm.

Then, a sheet-like joint member (three-layer structure) having the conductive layer (α) between the thermoplastic resin layer (β1) and the thermoplastic resin layer (β2) was obtained by peeling off the PET film.

(II-2) Step:

Then, the sheet-like joint member was laminated on the printed wiring board, and a chip resistor was mounted by heating the chip resistor at 120° C. for 80 seconds using a chip mounter and then heating the chip resistor at 230° C. for 60 seconds, thereby obtaining a circuit board.

The circuit board obtained in Example 2 was cut in a direction perpendicular to the surface of the printed wiring board, and the cross-section of the connection portion between an electronic component (chip resistor) and the printed wiring board was observed.

Figure 5:
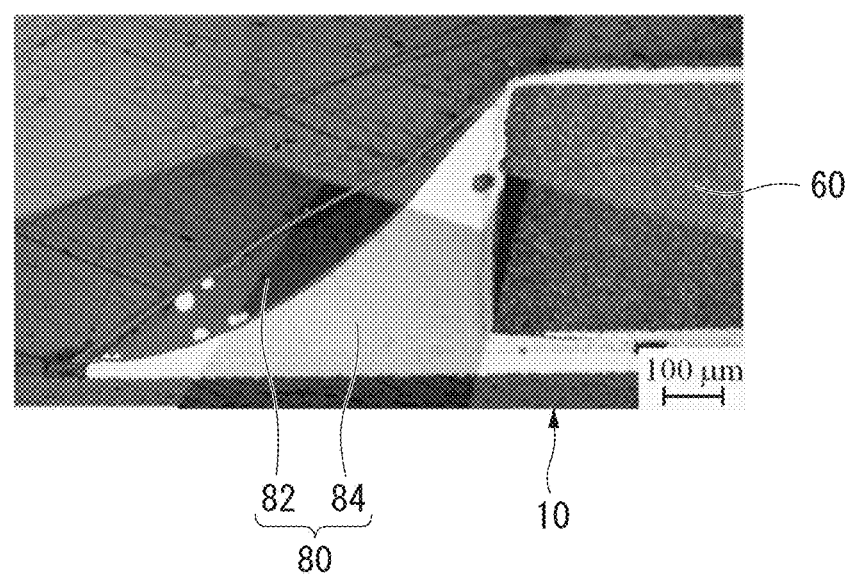
FIG. 5 is a cross-sectional photograph showing a connection portion between an electronic component and a printed wiring board in a circuit board obtained in a second example.

FIG. 5 is a cross-sectional photograph obtained by photographing the cross-section using a scanning electron microscope (SEM: "JSM-6360LV" made by JEOL Co., Ltd., observed at an acceleration voltage of 15 kV).

From FIG. 5, it can be seen that the electronic component 60 (chip resistor) and the printed wiring board 10 are satisfactorily connected to each other through the solderjoint portion 80 and the metal connection portion 84 is protected by the resin layer 82 in the solder Joint portion 80.

While preferred embodiments of the invention have been described and illustrated above, it should be understood that these are exemplary of the invention and are not to be considered as limiting.

Additions, omissions, substitutions, and other modifications can be made without departing from the scope of the present invention.

Accordingly, the invention is not to be considered as being limited by the foregoing description, and is only limited by the scope of the appended claims.

What is claimed is:

1. A method of mounting electronic component, the method comprising the steps of:
providing a conductive layer on at least one wiring disposed on a surface of a printed wiring board, the conductive layer being formed of a solder powder-containing resin composition containing thermosetting resin, solder powder, and a reducing agent;
providing a thermoplastic resin layer, which is formed of thermoplastic resin, on the conductive layer such that the thermoplastic resin layer covers the conductive layer, and directly on a portion of the surface of the printed wiring board positioned next to the wiring in a direction parallel with the surface of the printed wiring board;
disposing an electronic component on the conductive layer such that the thermoplastic resin layer is positioned between the conductive layer and the electronic component; and
electrically connecting the electronic component to the wiring through the conductive layer by heating the conductive layer and the thermoplastic resin layer to a melting point or higher of the solder powder.

2. The method of mounting electronic component according to claim 1,
wherein a thermosetting resin having a viscosity, at which the solder powder flows within the conductive layer at a temperature at which the solder powder melts, is used as the thermosetting resin.

\* \* \* \* \*